US012579414B2

(12) United States Patent
Cincon et al.

(10) Patent No.: US 12,579,414 B2
(45) Date of Patent: Mar. 17, 2026

(54) ARTIFICIAL NEURON

(71) Applicant: STMicroelectronics France, Montrouge (FR)

(72) Inventors: Valerian Cincon, Villard Bonnot (FR); Philippe Galy, Le Touvet (FR)

(73) Assignee: STMicroelectronics France, Montrouge (FR)

( * ) Notice: Subject to any disclaimer, the term of this patent is extended or adjusted under 35 U.S.C. 154(b) by 1163 days.

(21) Appl. No.: 17/499,506

(22) Filed: Oct. 12, 2021

(65) Prior Publication Data

US 2022/0121913 A1 Apr. 21, 2022

(30) Foreign Application Priority Data

Oct. 16, 2020 (FR) ...................................... 2010639

(51) Int. Cl.
| | |
|---|---|
| *G06N 3/063* | (2023.01) |
| *G06N 3/049* | (2023.01) |
| *G06N 3/065* | (2023.01) |
| *H03K 3/356* | (2006.01) |

(52) U.S. Cl.
CPC ............. *G06N 3/063* (2013.01); *G06N 3/049* (2013.01); *H03K 3/356113* (2013.01); *G06N 3/065* (2023.01)

(58) Field of Classification Search
CPC G06N 3/04; G06N 3/06; G06N 3/061; G06N 3/063; G06N 3/065; G06N 3/049; H03K 3/356113
See application file for complete search history.

(56) References Cited

U.S. PATENT DOCUMENTS

| | | | |
|---|---|---|---|
| 6,242,988 B1 | 6/2001 | Sarpeshkar | |
| 2019/0147328 A1 | 5/2019 | Burr et al. | |
| 2021/0216856 A1 | 7/2021 | Danneville et al. | |
| 2022/0058480 A1* | 2/2022 | Park ...................... | G06N 3/049 |

FOREIGN PATENT DOCUMENTS

| | | |
|---|---|---|
| CN | 207302125 U | 5/2018 |
| CN | 108446762 A | 8/2018 |
| CN | 109478249 A | 3/2019 |
| CN | 217279611 U | 8/2022 |
| FR | 3064383 A1 | 9/2018 |

OTHER PUBLICATIONS

S. Tuli et al., Design of a Conventional-Transistor-Based Analog Integrated Circuit for On-Chip Learning in a Spiking Neural Network, ICONS 2020, ACM, Jul. 28-30, 2020 (Year: 2020).*

(Continued)

*Primary Examiner* — Emily E Larocque
(74) *Attorney, Agent, or Firm* — Crowe & Dunlevy LLC

(57) ABSTRACT

An artificial neuron includes a first capacitive node of application of a membrane potential of the neuron. A first transistor is configured to discharge the first capacitive node. A second capacitive node is driven according to the membrane potential and delivers a potential for controlling the first transistor. A second transistor is configured to discharge the second capacitive node. The second transistor is controlled according to a potential present at the second capacitive node.

18 Claims, 6 Drawing Sheets

(56) References Cited

OTHER PUBLICATIONS

Aamir Syed Ahmed et al.: "An Accelerated LIF Neuronal Network Array for a Large-Scale Mixed-Signal Neuromorphic Architecture", IEEE Transactions on Circuits and Systems I: Regular Papers, vol. 65, n° 12, Jun. 27, 2018—XP 011703631.

INPI Search Report and Written Opinion for FR 2010639 dated Aug. 6, 2021 (10 pages).

Jayawan H B Wijekoon et al.: "A CMOS circuit implementation of a spiking neuron with bursting and adaptation on a biological timescale" 2009 IEEE Biomedical Circuits and Systems Conference (BIOCAS), Nov. 26, 2009—XP031594975.

Shih-Chii Liu et al.: "7. Silicon Neuron Circuit Blocks" In: "Event-Based Neuromorphic Systems", 16 février 2015—XP055829293.

CN First Office Action and Search Report for counterpart CN Appl. No. 202111201593.4, report dated Dec. 19, 2024, 11 pgs.

CN Second Office Action and Search Report for counterpart CN Appl. No. 202111201593.4, report dated Jun. 30, 2025, 11 pgs.

Liu, Shih-Chii, et al.: "Event-Based Neuromorphic Systems," University of Zurich and ETH Zurich Switzerland, Wiley, Online Library, Published 2015, 32 pgs.

CN Notice of Allowance for counterpart CN Appl. No. 202111201593. 4, report dated Nov. 26, 2025, 4 pgs.

* cited by examiner

ARTIFICIAL NEURON

PRIORITY CLAIM

This application claims the priority benefit of French Application for Patent No. 2010639, filed on Oct. 16, 2020, the content of which is hereby incorporated by reference in its entirety to the maximum extent allowable by law.

TECHNICAL FIELD

The present disclosure generally concerns electronic devices and, more particularly, electronic devices implementing artificial neurons.

BACKGROUND

Among existing artificial neurons, spiking neurons capable of generating a pulse response according to excitation signals applied on their membrane by one or a plurality of other neurons are particularly known. These spiking neurons may however have malfunctions when they are strongly excited.

There is a need to improve existing spiking neurons.

SUMMARY

An embodiment overcomes all or part of the disadvantages of known spiking neurons.

In an embodiment, an electronic circuit of an artificial neuron comprises: a first capacitive node of application of a membrane potential of the neuron; a first transistor for discharging the first capacitive node; a second capacitive node driven according to the membrane potential and delivering a potential for controlling the first transistor; and a second transistor for discharging the second capacitive node, wherein the second transistor is controlled according to a potential present at the second capacitive node.

According to an embodiment, the circuit further comprises a circuit for controlling the second transistor configured to activate the second transistor as a response to a discharge of the second capacitive node below a threshold.

According to an embodiment, the control circuit comprises an inverter having its input connected to the second capacitive node and having its output connected to the gate of the second transistor.

According to an embodiment, the second capacitive node is coupled to the first capacitive node by first and second inverters.

According to an embodiment, the circuit further comprises a third transistor connected between the gate of the second transistor and a third node of application of a reference potential, the gate of the third transistor being coupled to a fourth node, located between the first and second inverters, by a third inverter.

According to an embodiment, the circuit further comprises a fourth transistor coupled to the first capacitive node and to a fourth node of application of a potential for powering the neuron.

According to an embodiment, the gate of the fourth transistor is connected to an output of a NOR gate comprising a first input connected to the gate of the second transistor and a second input connected to the first capacitive node.

According to an embodiment, the fourth transistor is coupled to the first capacitive node by a fifth transistor having its gate intended to receive a potential for exciting the neuron.

An embodiment provides an artificial neural network comprising at last one circuit such as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the architecture of the spiking neuron networks and the processing operations carried out by these networks are not detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

Figure 1:
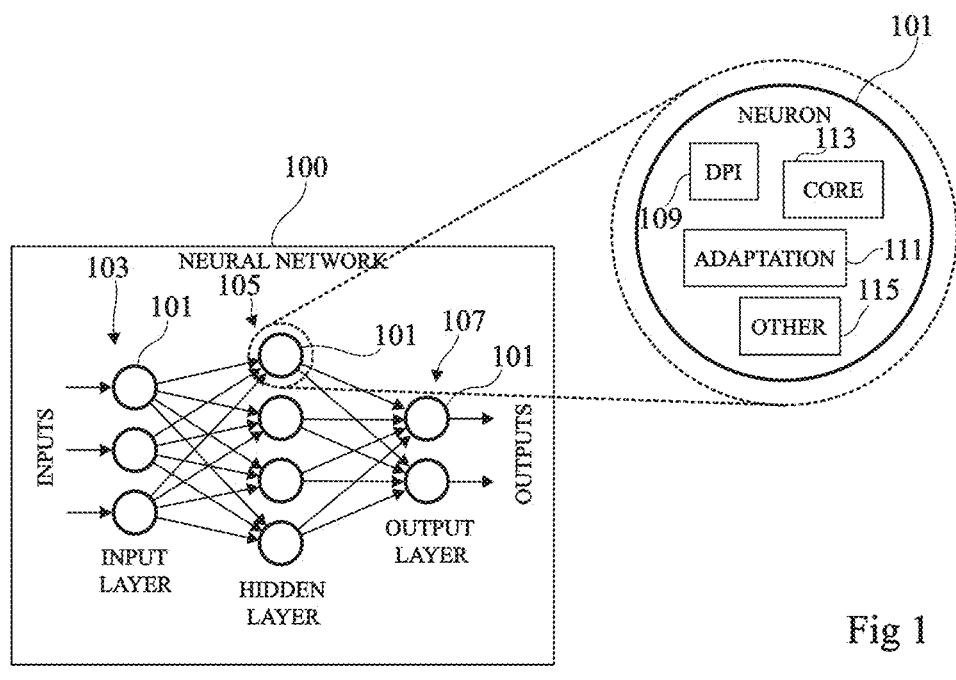
FIG. 1 schematically shows in the form of blocks an example of an artificial neural network.

FIG. 1 schematically shows in the form of blocks an example of a network 100 (NEURAL NETWORK) of artificial neurons 101 (NEURON).

Network 100 typically comprises a plurality of layers of artificial neurons 101. In the shown example, network 100 more particularly comprises an input layer 103 (INPUT LAYER), configured to receive one or a plurality of input signals (INPUTS), an intermediate layer or hidden layer 105 (HIDDEN LAYER), configured to process these input signals, and an output layer 107 (OUTPUT LAYER), configured to generate one or a plurality of output signals (OUTPUTS) originating from the processing by hidden layer 105.

Although a single hidden layer 105 is shown in FIG. 1, network 100 of artificial neurons 101 may comprise several tens or even several hundreds of hidden layers 105, according to the complexity of network 100. Further, although the input layer 103, the hidden layer 105, and the output layer 107 illustrated in FIG. 1 respectively comprise three, four, and two neurons 101, each layer 103, 105, 107 may comprise any non-zero integral number of neurons 101.

Network 100 of artificial neurons 101 is, for example, used in applications of writing recognition, voice recognition, or image recognition, for example, facial recognition. In the case of a facial recognition application, the neurons 101 of the input layer 103 of network 100 receive as an input data originating, for example, from images having been previously submitted to operations of preprocessing and feature extraction. These data are then processed by the hidden layer(s) 105 of network 100, for example, by being compared with a face database. At its output, network 100, for example, indicates whether the images comprise or not one of the faces present in the database.

In the shown example, each neuron 101 of network 100 comprises an integrator module 109 (DPI), an adaptation module 111 (ADAPTATION), and a core module 113 (CORE). Each neuron 101 of network 100 may further comprise one or a plurality of other modules. These modules are symbolized in FIG. 1 by a single block 115 (OTHER).

Integrator module 109, for example, receives a synaptic input signal originating from a plurality of other neurons 101 of network 100. As an example, integrator module 109 is a module of integration of differential pairs ("Differential Pair Integrator"). Module 109, for example, enables a linear artificial neuron to generate an exponential response when this neuron is excited by signals having an amplitude smaller than its firing threshold.

Adaptation module 111 is, for example, connected to an output of integrator module 109. As an example, adaptation module 111 enables to imitate a biological adaptation phenomenon. Adaptation module 111, for example, enables to ascertain that neuron 101 is more difficult to fire if it has recently emitted a spike.

Core module 113 is, for example, connected to an output of adaptation module 111. As an example, core module 113 enables to imitate the operation of an axon hillock of a real neuron.

Figure 2:
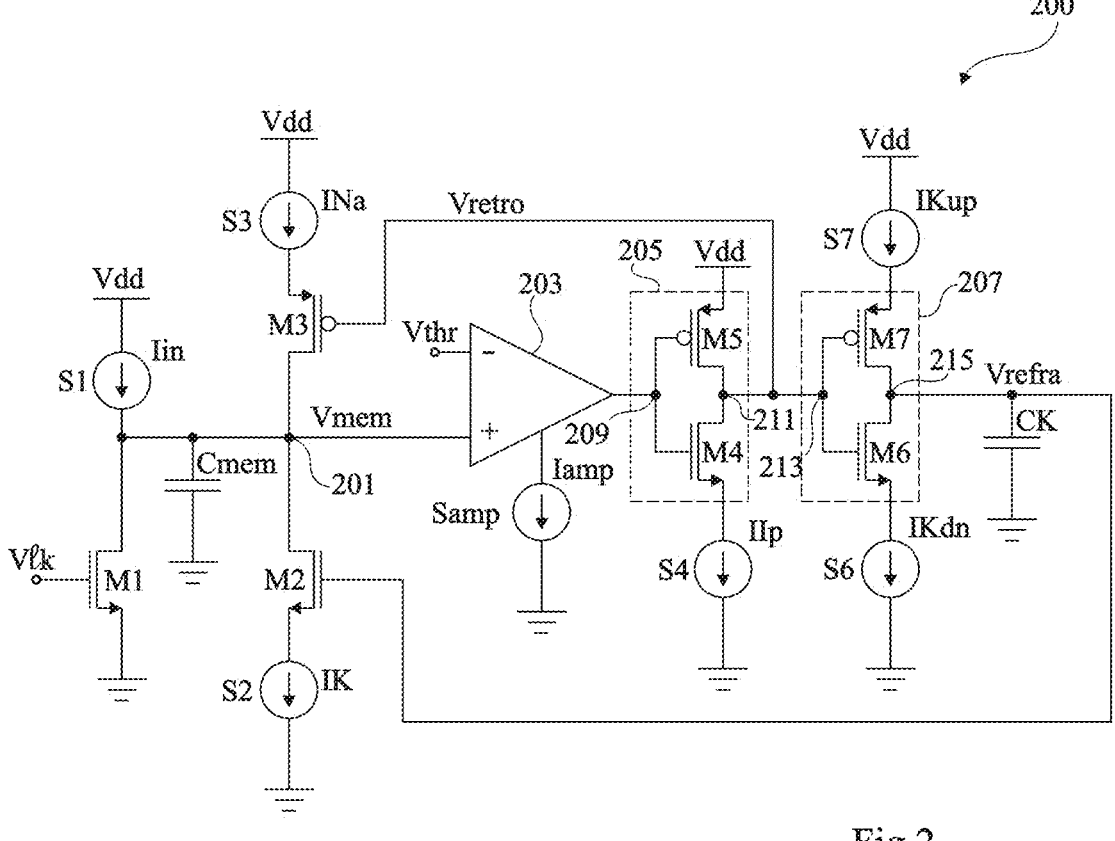
FIG. 2 is an electronic circuit of an example of implementation of a spiking neuron.

FIG. 2 is an electronic circuit of an example of implementation of a spiking neuron 200, for example, similar to the circuit described in chapter 7 of the book "Event-Based Neuromorphic Systems" (ISBN: 9780470018491), incorporated herein by reference. Spiking neuron 200, for example, enables to implement all or part of the artificial neuron 101 of FIG. 1.

In the shown example, neuron 200 comprises a current source S1 supplying an electric current noted Iin. Source S1 for example has a node connected to a node of application of a potential Vdd, for example corresponding to a power supply voltage of neuron 200, and another node connected to a node 201. The potential of node 201, for example corresponding to a membrane voltage of neuron 200, is noted Vmem.

As illustrated in FIG. 1, neuron 200 further comprises a capacitive element Cmem. Capacitive element Cmem, for example, has an electrode connected to node 201 and another electrode connected to a node of application of a reference potential, for example, the ground.

In the shown example, neuron 200 further comprises transistors M1, M2, and M3. Transistors M1, M2, and M3 are, for example, transistors of metal-oxide-semiconductor type, more simply called MOS transistors. More particularly, in the shown example, transistors M1 and M2 are N-channel MOS transistors, or NMOS transistors, while transistor M3 is a P-channel MOS transistor, or PMOS transistor.

In the shown example: NMOS transistor M1 has its source connected to the node of application of the reference potential and its drain connected to node 201; NMOS transistor M2 has its source connected to a node of a current source S2, the other node of source S2 being connected to the node of application of the reference potential, and its drain connected to node 201; and PMOS transistor M3 has its source connected to a node of a current source S3, the other node of source S3 being connected to the node of application of potential Vdd, and its drain connected to node 201.

Current sources S2 and S3, for example, respectively supply electric currents noted IK and INa.

In the shown example, neuron 200 further comprises an operational amplifier 203. Operational amplifier 203, for example, receives a potential Vthr on its inverting input (−) and potential Vmem on its non-inverting input (+). Potential Vthr, for example, defines a firing threshold of neuron 200. Amplifier 203 is, for example, limited in terms of current by a current source Samp, connected between operational amplifier 203 and the node of application of the reference potential. Source Samp, for example, supplies a maximum electric current noted Tamp.

In the shown example, neuron 200 further comprises two inverting logic gates 205 and 207, or inverters. In this example, logic gate 205 comprises an input node 209, connected to the output of operational amplifier 203, and an output node 211, connected to the gate of transistor M3. Logic gate 207 comprises an input node 213, connected to the output node 211 of logic gate 205, and an output node 215, connected to the gate of transistor M2. The potential of nodes 211 and 213 is noted Vretro and the potential of node 215 is noted Vrefra.

As an example, inverting logic gate 205 more particularly comprises: an NMOS transistor M4 having its source connected to a node of a current source S4, the other node of source S4 being connected to the node of application of the reference potential, and having its drain connected to node 211; and a PMOS transistor M5 having its source connected to the node of application of potential Vdd and having its drain connected to node 211.

Inverting logic gate 207, for example, more particularly comprises: an NMOS transistor M6 having its source connected to a node of a current source S6, the other node of source S6 being connected to the node of application of the reference potential, and having its drain connected to node 215; and a PMOS transistor M7 having its source connected to a node of a current source S7, the other node of source S7 being connected to the node of application of potential Vdd, and having its drain connected to node 215.

Current sources S4, S6, and S7, for example, respectively supply electric currents noted IIp, IKdn, and IKup.

In the shown example: the gate of transistor M1 receives a potential WI, for example, enabling to conduct a leakage current from neuron 200 through transistor M1; the gate of transistor M2 receives the potential Vrefra of the output node 215 of gate 207; the respective gates of transistors M3, M6, and M7 each receive the potential Vretro of the output node 211 of gate 205; and the respective gates of transistors M4 and M5 each receive a potential present at the output of operational amplifier 203.

In the shown example, neuron 200 further comprises another capacitive element CK. Capacitive element CK is, for example, connected between the output node 215 of gate 207 and the node of application of the reference potential.

Figures 3, 4:
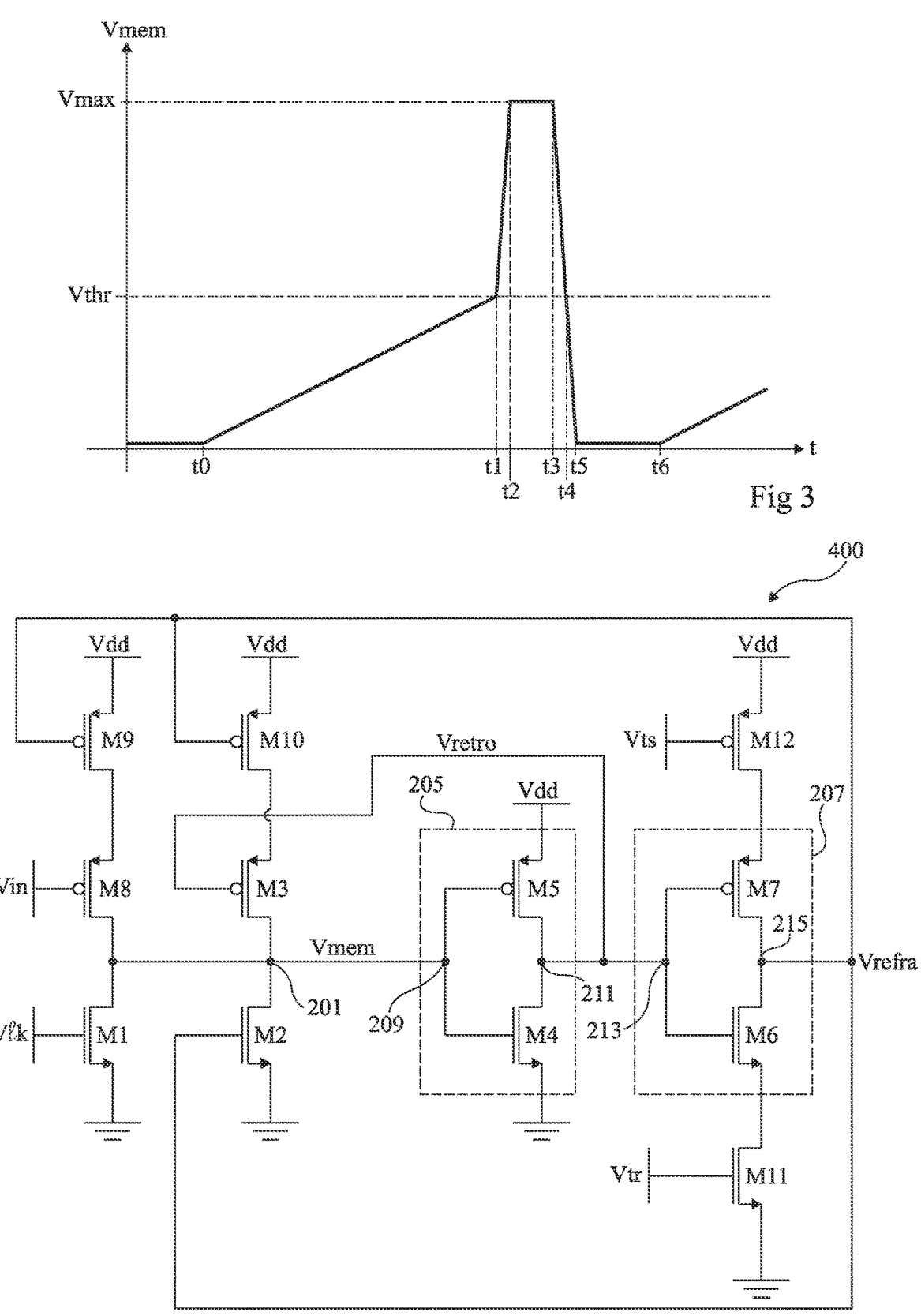
FIG. 3 is a timing diagram illustrating an example of operation of the circuit of FIG. 2.
FIG. 4 is an electronic circuit of another example of implementation of a spiking neuron.

FIG. 3 is a timing diagram illustrating an example of operation of the circuit of FIG. 2. The timing diagram of FIG. 3 more particularly illustrates the variation, according to time t, of the potential Vmem present at node 201 of neuron 200.

It is initially assumed, at a time t0, that the potential Vmem of node 201 is substantially null and smaller than the firing threshold Vthr of neuron 200. The output of operational amplifier 203 then, for example, applies a low voltage close to the reference potential on the input node 209 of inverting logic gate 205. In this case, NMOS transistor M4 is off while PMOS transistor M5 is on. The potential Vrefra of the output node 211 of gate 205, applied to the gate of PMOS transistor M3, is thus substantially equal to potential Vdd. PMOS transistor M3 is then turned off.

Still at time t0, the potential Vretro present at the input node 213 of inverting logic gate 207 is substantially equal to potential Vdd. In this case, NMOS transistor M6 is on while PMOS transistor M7 is off. This results in taking the output node 215 of gate 207, and thus the gate of NMOS transistor M2, to the reference potential. NMOS transistor M2 is then turned off.

At time t0, it is further assumed that capacitive elements Cmem and CK are empty. Source S1 supplies current Iin, which results in starting to charge capacitive element Cmem. In other words, an integration by capacitive element Cmem of the current Iin supplied by source S1 is started at time t0. The value of the potential Vmem present at node 201 then increases as capacitive element Cmem charges.

At a time t1 subsequent to time t0, the value of the potential Vmem present at node 201 exceeds the firing threshold Vthr of neuron 200. This then causes a switching of the output of operational amplifier 203 from the low voltage to a positive voltage+Vsat.

This results in turning on transistors M4 and M7, while transistors M5 and M6 turn off. The potential Vretro of node 211 is thus pulled to ground. Transistor M3 then turns on. From time t1, capacitive element Cmem is charged not only by source S1, supplying current Iin, but also by source S3, supplying current INa. This accelerates the charge of capacitive element Cmem and potential Vmem then starts increasing more rapidly than between times t0 and t1.

Further, still at time t1, capacitive element CK starts charging due to the current IKup supplied by source S7. This results in progressively increasing the potential Vrefra present at the output node 215 of inverter 207.

At a time t2 subsequent to time t1, potential Vmem reaches a maximum value Vmax. The maximum value Vmax reached by potential Vmem at time t2 is, for example, conditioned by potential Vdd.

From time t2, potential Vmem remains substantially constant and equal to Vmax until a time t3 subsequent to time t2.

It is assumed, at time t3, that potential Vrefra reaches a value sufficient to switch transistor M2 from the off state to the on state. The period separating time t2 from time t3 is, for example, conditioned by the value of capacitive element CK and by the value of the current IKup supplied by source S7.

Assuming that the current IK conveyed by source S2 is greater than the sum of the currents Iin and INa respectively supplied by sources S1 and S3, capacitive element Cmem starts discharging at time t3. This then causes a decrease in the potential Vmem present at node 201.

At a time t4 subsequent to time t3, the value of potential Vmem becomes smaller than the firing threshold Vthr of neuron 200. This, for example, causes a switching of the output of operational amplifier 203 from positive voltage+ Vsat to the low voltage close to the reference potential.

This results in turning on transistors M5 and M6, while transistors M4 and M7 turn off. The potential Vretro of the output node 211 of inverter 205 is thus substantially equal to potential Vdd. Transistor M3 is then turned off, which stops the supply of current INa by source S3.

Still at time t4, source S6 starts conveying current IKdn. This results in starting the discharge of capacitive element CK and in decreasing the potential Vrefra of the output node 215 of inverter 207.

At a time t5 subsequent to time t4, it is assumed that potential Vmem reaches a value substantially equal to the reference potential.

In the shown example, the variation of potential Vmem between times t1 and t5 corresponds to the generation, by neuron 200, of a spike having a duration equal to t3−t2.

From time t5, potential Vmem remains substantially constant and equal to the reference potential until a time t6 subsequent to time t5.

The period separating time t5 from time t6 is called refractory period of neuron 200. During this period, potential Vrefra is sufficiently significant to prevent the switching of transistor M2 from the on state to the off state. In an ideal case, whatever the current Iin of source S1 during the refractory period, neuron 200 emits no spike.

At time t6, it is assumed that potential Vrefra reaches a value sufficiently low to switch transistor M2 from the on state to the off state. The duration separating time t5 from time t6 is, for example, conditioned by the value of capacitive element CK and by the value of the current IKdn conveyed by source S6.

In the shown example, time t6 marks the beginning of a new integration phase similar to that previously discussed in relation with time t0. This, for example, corresponds to a situation where neuron 200 is submitted to a constant excitation.

FIG. 4 is an electronic circuit of another example of implementation of a spiking neuron 400.

The neuron 400 of FIG. 4 comprises elements common with the neuron 200 of FIG. 2. These common elements will not be detailed again hereafter. The neuron 400 of FIG. 4 differs from the neuron 200 of FIG. 2 mainly in that capacitive elements Cmem and CK, obtained by discrete components in the example of neuron 200, are replaced with stray capacitances in the example of neuron 400. As an example, in neuron 400, advantage is taken of gate capacitances of transistors M4 and M2 to play the role of capacitive elements Cmem and CK, respectively.

In the neuron 400 of FIG. 4, current sources S1, S2, S3, S4, S6, and S7 as well as operational amplifier 203 are omitted with respect to the neuron 200 of FIG. 2. More particularly, in the shown example: the drain of transistor M1 is connected to the drain of a PMOS transistor M8; transistor M8 has its source connected to the drain of a PMOS transistor M9, the source of transistor M9 being connected to the node of application of potential Vdd; the source of transistor M3 is connected to the drain of a PMOS transistor M10, the source of transistor M10 being connected to the node of application of potential Vdd; the source of transistor M6 is connected to the drain of an NMOS transistor M11, the source of transistor M11 being connected to the node of application of the reference potential; and the source of transistor M7 is connected to the drain of a PMOS transistor M12, the source of transistor M12 being connected to the node of application of potential Vdd.

In the shown example: the gate of transistor M8 receives a potential Vin; the respective gates of transistors M9 and M10 each receive the potential Vrefra of the output node 215 of inverting logic gate 207; the gate of transistor M11 receives a potential Vtr; and the gate of transistor M12 receives a potential Vts.

Potential Vin, for example, corresponds to an input potential of neuron 400. The potential Vtr for controlling transistor M11, for example, enables to adjust the duration of the refractory period of neuron 400. The potential Vts for controlling transistor M12, for example, enables to adjust the duration of the spiking phase (times t1 to t4 in FIG. 3) of neuron 400.

Neuron 400 has an operation similar to that of the neuron 200 previously described in relation with FIG. 3.

Figure 5:
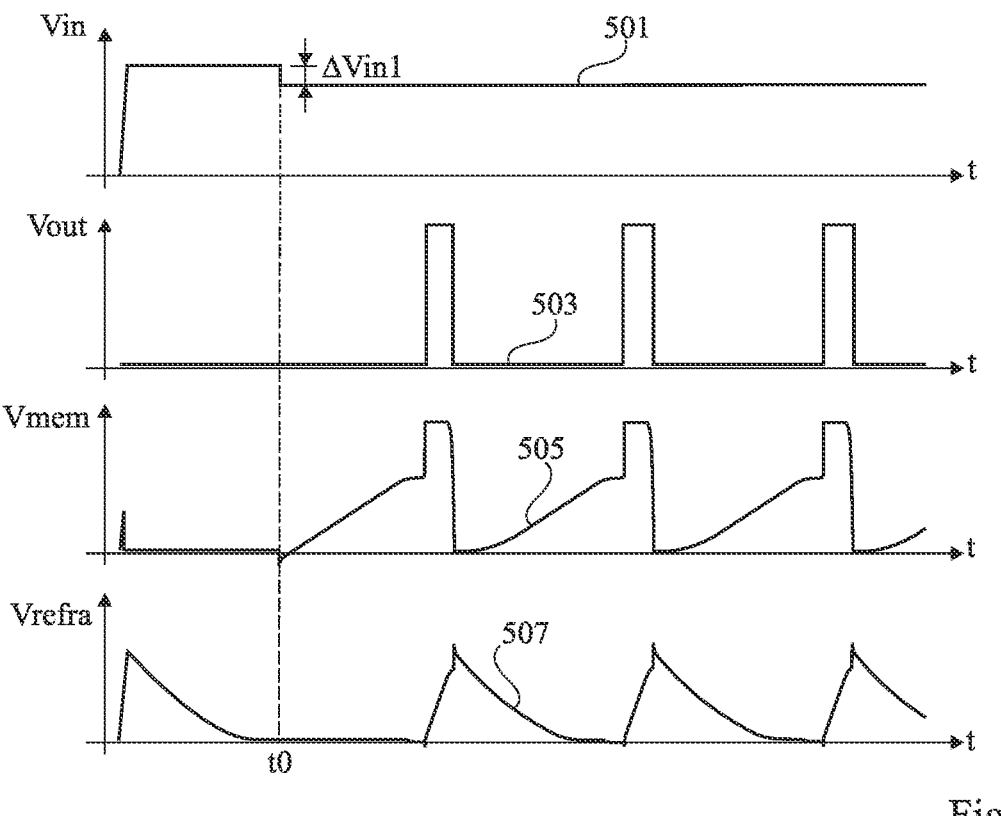
FIG. 5 is a timing diagram illustrating an example of operation of the circuit of the neuron of FIG. 4.

FIG. 5 is a timing diagram illustrating an example of operation of the circuit of the neuron 400 of FIG. 4. The timing diagram of FIG. 5 more particularly illustrates, in curves 501, 503, 505, and 507, the variation according to time t: of the input potential Vin applied to the gate of transistor M8; of an output potential noted Vout, for example, which is an image of the potential Vretro present at nodes 211 and 213; of the potential Vmem present at node 201; and of the potential Vrefra applied to the gate of transistor M2.

In the shown example, after an initialization period of neuron 400, a potential step noted ΔVin1 is applied to the gate of transistor M8 at a time t0. From time t0, potential Vmem undergoes several times a variation similar to that previously described in relation with FIG. 3. More particularly, potential Vmem particularly successively passes through integration, spiking, and refraction phases or periods.

In the shown example, potential Vout is at a high level during spiking phases, for example, when the potential Vretro of output node 211 of gate 205 is substantially equal to potential Vdd. However, potential Vout is at a low level during refraction integration phases, for example, when potential Vretro is substantially equal to the reference potential.

In the shown example, the potential Vrefra of the output node 215 of gate 207 increases during spiking phases. However, potential Vrefra decreases during refractory periods and integration phases. In this example of operation, potential Vrefra reaches a value equal to the reference potential before the beginning of each new spiking phase, node 215 for example totally discharging during each integration phase.

In the shown example, curve 503 illustrating the variations of potential Vout comprises pulses having a substantially constant width, or duration. Further, refractory periods are clearly distinct from integration phases as illustrated by curve 505 of variation of potential Vmem.

Figure 6:
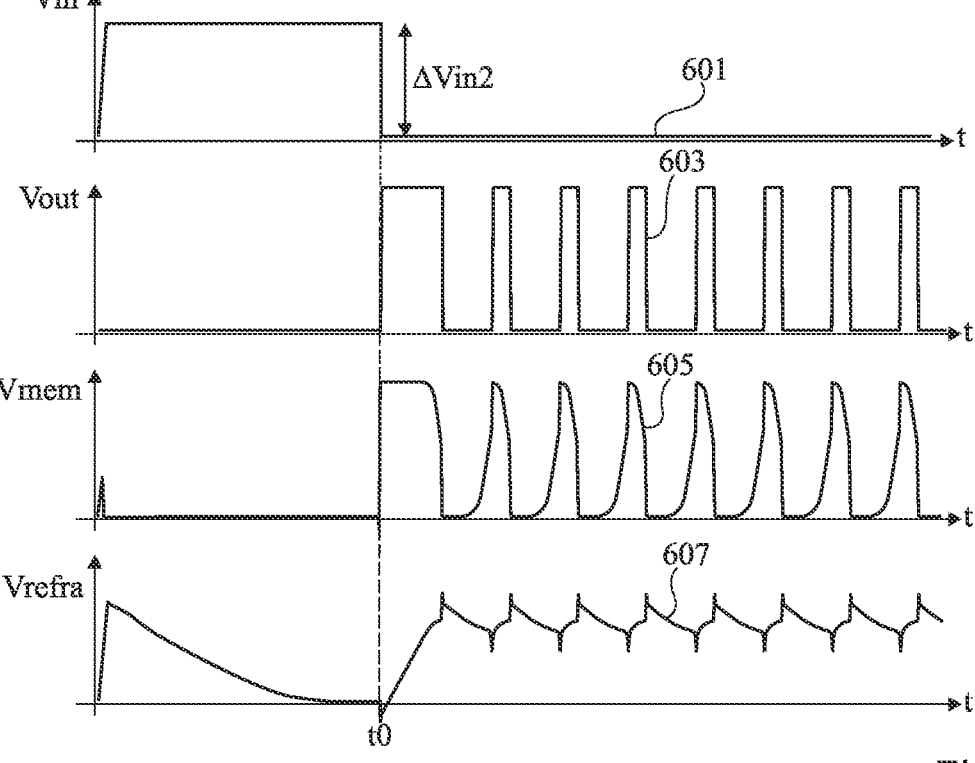
FIG. 6 is a timing diagram illustrating another example of operation of the circuit of the neuron of FIG. 4.

FIG. 6 is a timing diagram illustrating another example of operation of the circuit of the neuron 400 of FIG. 4. The timing diagram of FIG. 6 more particularly illustrates, in curves 601, 603, 605, and 607, the variation according to time t: of the input potential Vin applied to the gate of transistor M8; of an output potential noted Vout, for example, which is an image of the potential Vretro present at nodes 211 and 213; of the potential Vmem present at node 201; and of the potential Vrefra applied to the gate of transistor M2.

The example of operation illustrated in FIG. 6 differs from the example of operation illustrated in FIG. 5 mainly in that a potential step ΔVin2 having a height, or amplitude, greater than that of potential step ΔVin1 is applied to the gate of transistor M8 at time t0.

The timing diagram of FIG. 6, for example, illustrates a case where neuron 400 is submitted to a strong synaptic excitation. This strong synaptic excitation is, for example, due to the fact that each neuron 400 comprises a significant number of synapses, or that a significant weight is assigned to each synapse.

In the shown example, curve 603 illustrating the variations of potential Vout comprises a first spike followed by a plurality of other spikes having a width, or duration, smaller than that of the first spike. This is particularly due to the fact that potential Vrefra does not reach a value equal to the reference potential before the beginning of each new spiking phase, and node 215, for example, does not totally discharge during integration phases but keeps a residual charge. As a result, during the next pulse phase, node 215 charges, not from a value of potential Vrefra substantially equal to the reference potential, as in the example of FIG. 5, but from a higher value due to the residual charge remaining at the end of the integration phase. This thus causes a decrease in the spiking time, which adversely affects the operation of neuron 400 as well as the processing performed by a network implementing neurons 400.

Further, refractory periods are difficult to make out from integration phases, as illustrated in curve 605 of variation of potential Vmem. This particularly results from the fact that the discharge, by transistor M2, of the charges present at node 201, does not enable to compensate for the arrival of charges from the node of application of potential Vdd under the effect of potential Vin.

To overcome these disadvantages, it could have been provided to use an NMOS transistor M2 of greater size, for example enabling to discharge a greater number of charges. However, this would not enable to solve the problem in a case where neuron 400 would, for example, be submitted to a synaptic excitation even greater than that illustrated in FIG. 6.

Figure 7:
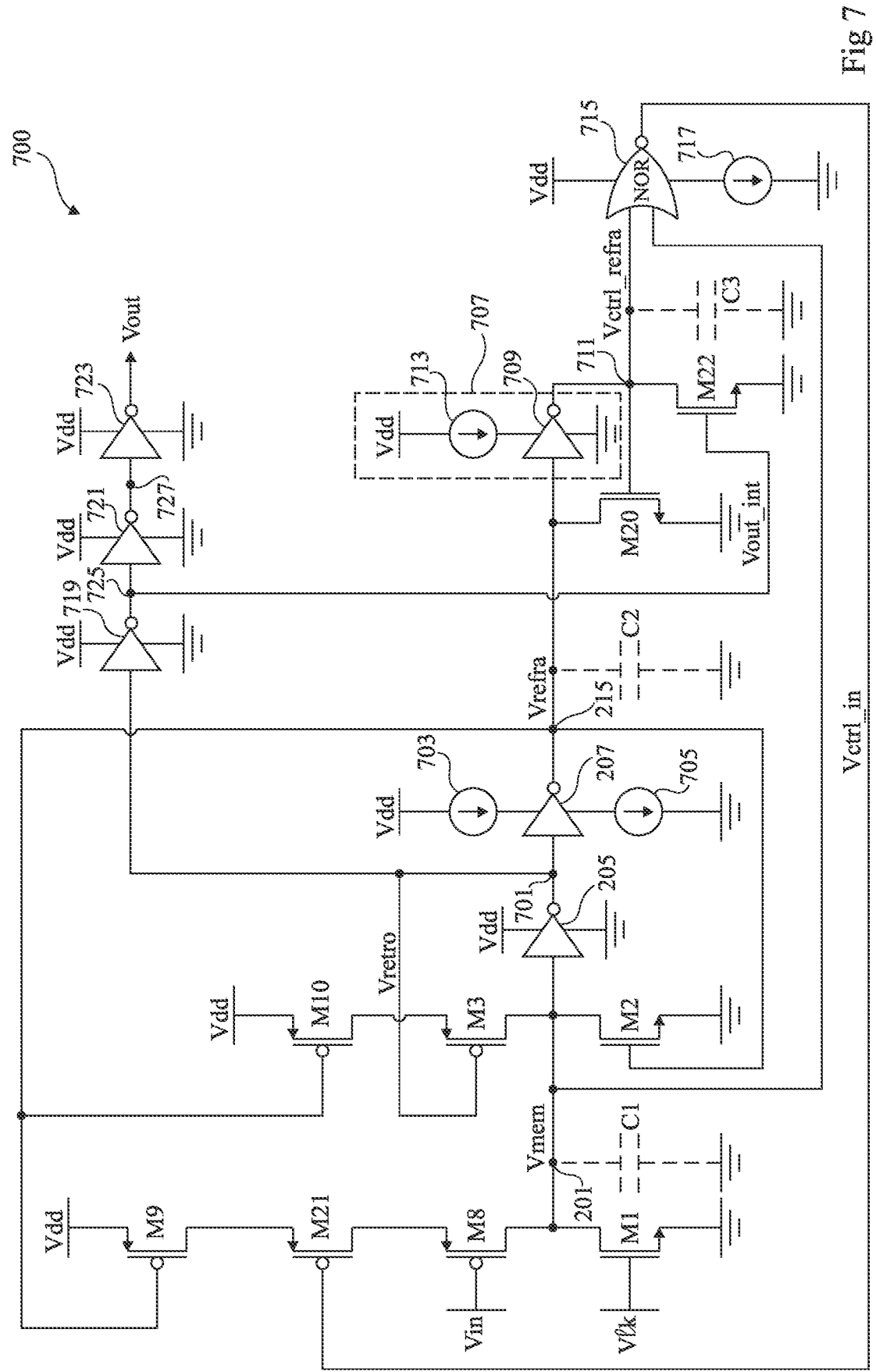
FIG. 7 is an electronic circuit of implementation of a spiking neuron according to an embodiment.

FIG. 7 is an electronic circuit of implementation of a spiking neuron 700 according to an embodiment.

The neuron 700 of FIG. 7 comprises elements common with the neuron 400 of FIG. 4. These common elements will not be detailed again hereafter.

In the shown example, neuron 700 comprises node 201 of application of membrane potential Vmem. Node 201 is, for example, a capacitive node. As an example, node 201 is formed by providing a capacitive element C1 connected between node 201 and a node of application of a reference potential, for example, the ground. As a variant, node 201 is formed by taking advantage of stray capacitances of the circuit of neuron 700.

In the shown example, neuron 700 further comprises transistor M2 of discharge of capacitive node 201. In the on state, transistor M2 enables to discharge to ground charges present at capacitive node 201.

In the shown example, neuron 700 further comprises the output node 215 of inverting logic gate 207. Node 215 is, for example, a capacitive node. As an example, capacitive node 215 is formed by providing a capacitive element C2 connected between node 215 and the node of application of the reference potential. As a variant, node 215 is formed by taking advantage of stray capacitances of the circuit of neuron 700.

Similarly to the neuron 400 of FIG. 4, the capacitive node 215 of neuron 700 is, for example, driven according to the membrane potential Vmem present at capacitive node 201. In the shown example, node 215 is separated from node 201 by the two inverting logic gates 205 and 207, series-connected between node 201 and node 215. More particularly, in this example, inverting logic gate 205 has its input connected to node 201 and its output connected to a node 701 and inverting logic gate 207 has its input connected to node 701 and its output connected to node 215. The node 701 of neuron 700 is, for example, equivalent to the nodes 211 and 213 of neuron 400.

In the shown example, gate 205 is further connected to a node of application of a potential Vdd, for example, a power supply potential of neuron 700, and to the node of application of the reference potential. Gate 207, for example, has its power supply nodes respectively connected to a node of a current source 703, the other node of source 703 being connected to the node of application of potential Vdd, and to a node of another current source 705, the other node of source 705 being connected to the node of application of the reference potential.

Capacitive node 215 delivers potential Vrefra for controlling discharge transistor M2. Node 215 is, for example, connected to the gate of transistor M2.

In the shown example, neuron 700 further comprises a transistor M20 of discharge of capacitive node 215. Transistor M20 is, for example, an N-channel MOS transistor (NMOS). In this example, transistor M20 has its source connected to the node of application of the reference potential and its drain connected to capacitive node 215. In the on state, transistor M20 enables to discharge to ground charges present at capacitive node 215.

Neuron 700, for example, comprises a circuit 707 for controlling discharge transistor M20. Control circuit 707 is, for example, configured to activate transistor M20 as a response to a discharge of capacitive node 215 below a threshold.

In the shown example, control circuit 707 comprises an inverting logic gate 709. Inverting logic gate 709 has its input connected to node 215 and its output connected to a capacitive node 711, capacitive node 711 being connected to the gate of transistor M20. In this example, inverting logic gate 709 has its power supply nodes respectively connected to a node of a current source 713, the other node of source 713 being connected to the node of application of potential Vdd, and to the node of application of the reference potential.

As an example, capacitive node 711 is formed by providing a capacitive element C3 connected between node 711 and the node of application of the reference potential. As a variant, node 711 is formed by taking advantage of stray capacitances of the circuit of neuron 700. The potential present at capacitive node 711 is noted Vctrl_refra.

In the shown example, neuron 700 further comprises a NOR logic gate 715. Logic gate 715, for example, has an input connected to capacitive node 711 and another input connected to capacitive node 201. Logic gate 715 has its power supply nodes connected to the node of application of potential Vdd and to a node of a current source 717, the other node of current source 717 being connected to the node of application of the reference potential. At the output, logic gate 715, for example, delivers a binary signal noted Vctrl_in.

In the shown example, neuron 700 further comprises a transistor M21. Transistor M21 is, for example, a P-channel MOS transistor (PMOS). In this example, transistor M21 is interposed between transistors M8 and M9. More particularly, transistor M21 has its source connected to the drain of transistor M9 and its drain connected to the source of transistor M8. As a variant, transistor M21 may be coupled between transistor M8 and node 201, or between transistor M9 and the node of application of potential Vdd. In the off state, transistor M21 enables to block or to limit the electric current powering capacitive node 201 independently from the value of the potential Vin applied to the gate of transistor M8.

In the shown example, transistor M21 is controlled by the output of NOR logic gate 715. The gate of transistor M21 for example receives signal Vctrl_in.

In the shown example, neuron 700 further comprises three other inverting logic gates 719, 721, and 723 series-connected between node 701 and a node of delivery of an output potential Vout of neuron 700. More particularly, in this example: gate 719 has its input connected to node 701 and its output connected to a node 725; gate 721 has its input connected to node 725 and its output connected to a node 727; and gate 723 has its input connected to node 727 and its output connected to the node of delivery of potential Vout.

Further, each inverting logic gate 719, 721, 723 has its power supply nodes respectively connected to the node of application of potential Vdd and to the node of application of the reference potential.

In the shown example, neuron 700 comprises another transistor M22 of discharge of capacitive node 711. Transistor M22 is, for example, an N-channel MOS transistor (NMOS). In this example, transistor M22 has its source connected to the node of application of the reference potential and its drain connected to capacitive node 711. In the on state, transistor M22 enables to discharge to ground charges present at capacitive node 711.

Transistor M22 is, for example, controlled according to a potential noted Vout_int present at node 725. The gate of transistor M22 is, for example, connected to node 725.

Figure 8:
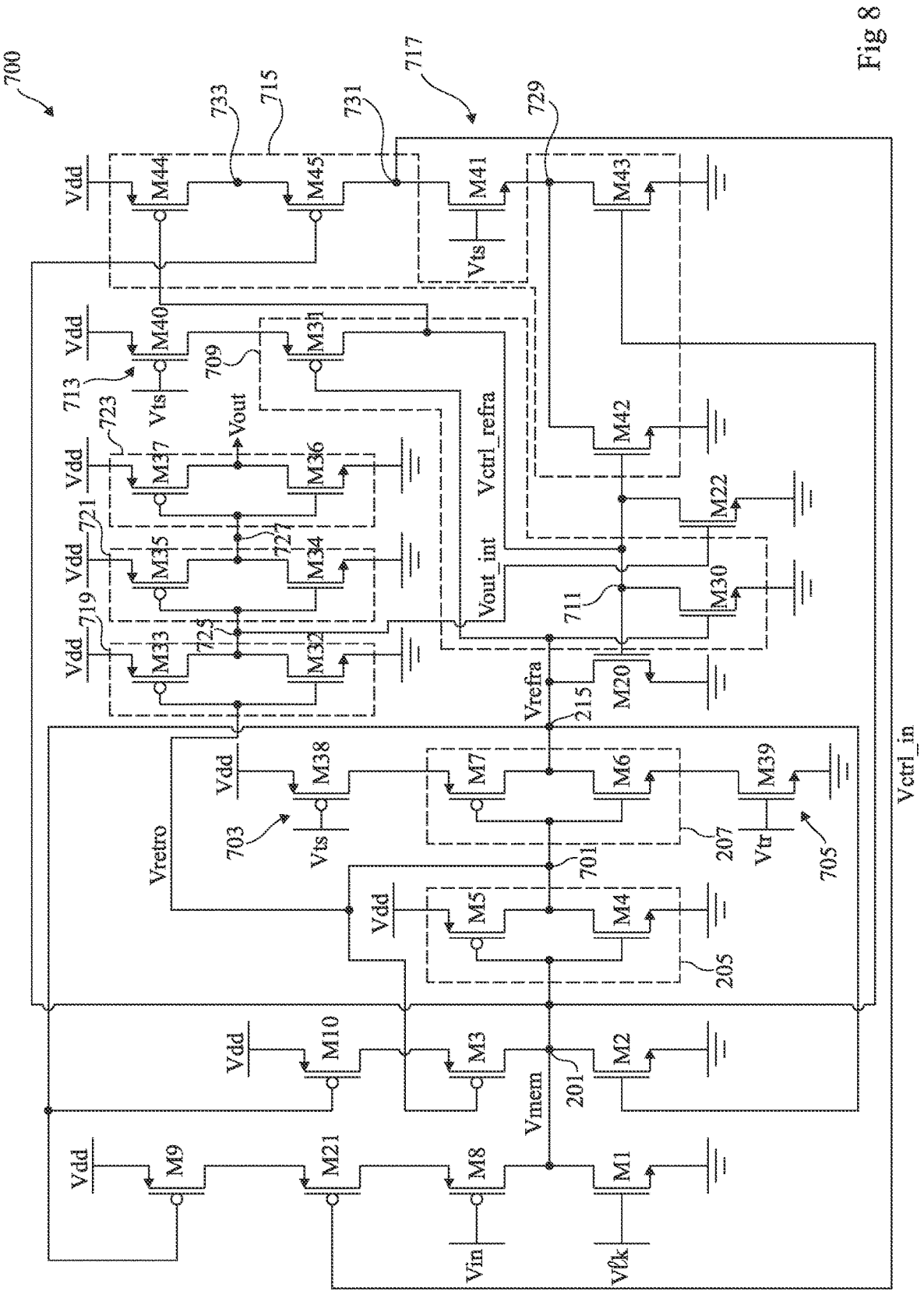
FIG. 8 is a more detailed embodiment of the electronic circuit of the neuron of FIG. 7.

FIG. 8 is a more detailed embodiment of the electronic circuit of the neuron 700 of FIG. 7 according to an embodiment.

In the shown example, inverters 205, 207, 709, 719, 721, and 723 are complementary metal-oxide-semiconductor inverters, more simply called CMOS inverters. Each CMOS inverter comprises a PMOS transistor and an NMOS transistor connected in series.

More particularly, in the shown example: inverter 205 comprises NMOS and PMOS transistors M4 and M5, the drains of NMOS and PMOS transistors M4 and M5 being connected to node 701, the source of NMOS transistor M4 being connected to the node of application of the reference potential, the source of PMOS transistor M5 being connected to the node of application of potential Vdd, and the gates of NMOS and PMOS transistors M4 and M5 being connected to capacitive node 201. Inverter 207 comprises NMOS and PMOS transistors M6 and M7, the drains of NMOS and PMOS transistors M6 and M7 being connected to node 215, the source of NMOS transistor M6 being connected to current source 705, the source of PMOS transistor M7 being connected to current source 703, and the gates of NMOS and PMOS transistors M6 and M7 being connected to node 701. Inverter 709 comprises an NMOS transistor M30 and a PMOS transistor M31, the drains of NMOS and PMOS transistors M30 and M31 being connected to capacitive node 711, the source of NMOS transistor M30 being connected to the node of application of the reference potential, the source of PMOS transistor M31 being connected to current source 713, and the gates of NMOS and PMOS transistors M30 and M31 being connected to capacitive node 215. Inverter 719 comprises an NMOS transistor M32 and a PMOS transistor M33, the drains of NMOS and PMOS transistors M32 and M33 being connected to node 725, the source of NMOS transistor M32 being connected to the node of application of the reference potential, the source of PMOS transistor M33 being connected to the node of application of potential Vdd, and the gates of NMOS and PMOS transistors M32 and M33 being connected to node 701. Inverter 721 comprises an NMOS transistor M34 and a PMOS transistor M35, the drains of NMOS and PMOS transistors M34 and M35 being connected to node 727, the source of NMOS transistor M34 being connected to the node of application of the reference potential, the source of PMOS transistor M35 being connected to the node of application of potential Vdd, and the gates of NMOS and PMOS transistors M34 and M35 being connected to node 725. Lastly, inverter 723 comprises an NMOS transistor M36 and a PMOS transistor M37, the drains of NMOS and PMOS transistors M36 and M37 being connected to the node of delivery of potential Vout, the source of NMOS transistor M36 being connected to the node of application of the reference potential, the source of PMOS transistor M37 being connected to the node of application of potential Vdd, and the gates of NMOS and PMOS transistors M36 and M37 being connected to node 727.

In the shown example: current source 703 comprises a PMOS transistor M38 having its source connected to the node of application of potential Vdd, its drain connected to the source of PMOS transistor M7, and its gate receiving potential Vts; current source 705 comprises an NMOS transistor M39 having its source connected to the node of application of the reference potential, its drain connected to the source of NMOS transistor M6, and its gate receiving potential Vtr; current source 713 comprises a PMOS transistor M40 having its source connected to the node of application of potential Vdd, its drain connected to the source of PMOS transistor M31, and its gate receiving potential Vts; and current source 717 comprises an NMOS transistor M41 having its source connected to a node 729, its drain connected to an output node 731 of NOR logic gate 715, and its gate receiving potential Vts.

Further, in the shown example, NOR logic gate 715 comprises: an NMOS transistor M42 having its source connected to the node of application of the reference potential, its drain connected to node 729, and its gate connected to capacitive node 711; an NMOS transistor M43 having its source connected to the node of application of the reference potential, its drain connected to node 729, and its gate connected to capacitive node 201; a PMOS transistor M44 having its source connected to the node of application of potential Vdd, its drain connected to node 733, and its gate connected to capacitive node 711; and a PMOS transistor M45 having its source connected to node 733, its drain connected to node 731, and its gate connected to capacitive node 201.

In the shown example, the output node 731 of NOR logic gate 715 is connected to the gate of transistor M21.

Figure 9:
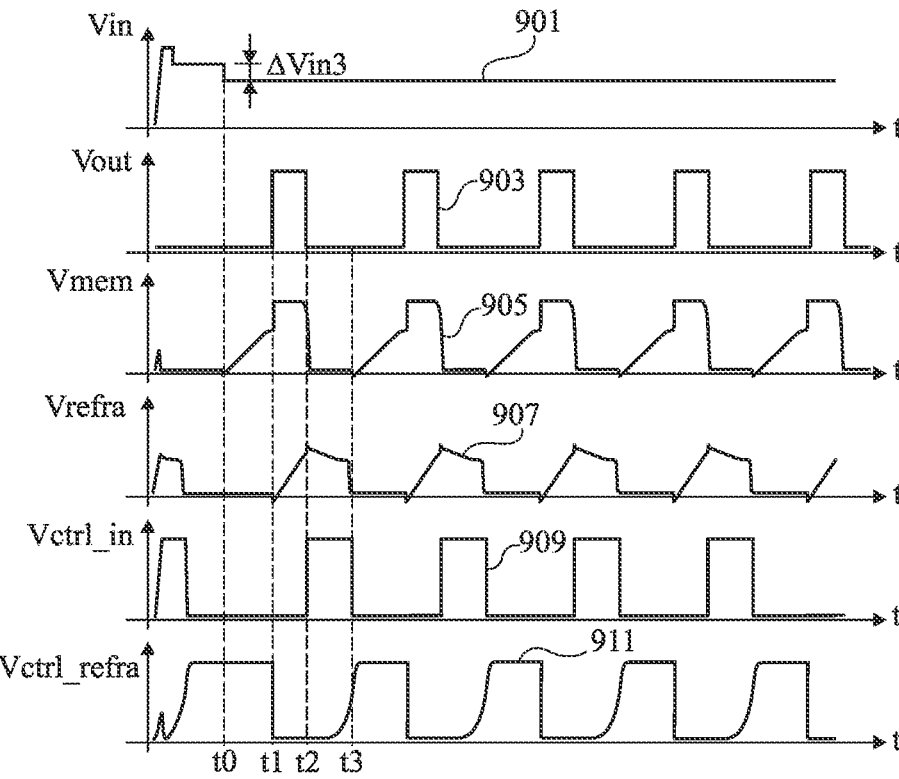
FIG. 9 is a timing diagram illustrating an example of operation of the circuit of the neuron of FIGS. 7 and 8.

FIG. 9 is a timing diagram illustrating an example of operation of the circuit of the neuron 700 of FIGS. 7 and 8.

The timing diagram of FIG. 9 more particularly illustrates, in curves 901, 903, 905, 907, 909, and 911, the variation according to time t: of input potential Vin; of output potential Vout; of membrane potential Vmem; of potential Vrefra for controlling transistor M2; of potential Vctrl_in for controlling transistor M21; and of potential Vctrl_refra for controlling transistor M20.

In the shown example, after a period of initialization of neuron 700, a potential step ΔVin3 is applied to the gate of transistor M8 at a time to. The amplitude of the potential step ΔVin3 of FIG. 9 is, for example, similar to the amplitude of the potential step ΔVin1 of FIG. 5.

In the following description, it is assumed, for simplification, that the reference potential is null, that is, substantially equal to 0 V.

At time t0, neuron 700 starts an integration phase. Capacitive node 215 being fully discharged at time t0, potential Vrefra is null. At the output of inverter 709, the potential Vctrl_refra of capacitive node 711 is in the high state. Transistor M20 is in an off state. At the output of NOR logic gate 715, potential Vctrl_in is in the low state. Transistor M21 is in an on state.

At a time t1, subsequent to time t0, inverters 205, 207, 719, 721, and 723 are switched. Neuron 700 then ends the integration phase and starts a spiking phase. Signal Vout switches to the high level. Capacitive node 215 starts charging, which results in an increase of potential Vrefra. The potential Vout_int of node 725 switches to the high state, thus switching transistor M22 from the off state to the on state. This discharges capacitive node 711, and the potential Vctrl_refra thereof becomes null. Transistor M20 remains in an off state. At the output of NOR logic gate 715, potential Vctrl_in remains in the low state. Transistor M21 remains in the on state.

At a time t2, subsequent to time t1, inverters 205, 207, 719, 721, and 723 are switched again. Neuron 700 then ends the spiking phase and starts a refractory period. Signal Vout switches to the low level. Capacitive node 215 starts discharging, which results in a decrease of potential Vrefra. The potential Vout_int of node 725 switches to the low state, thus switching transistor M22 from the on state to the off state. Capacitive node 711 then charges via the current source 713 of control circuit 707 (FIG. 7). At the output of NOR logic gate 715, potential Vctrl_in is switched from the low state to the high state. Transistor M21 is then switched from the on state to the off state.

At a time t3, subsequent to time t2, potential Vctrl_refra reaches a threshold of activation of transistor M20. Transistor M20 is switched from the off state to the on state, which results in discharging node 215. At time t3, the output potential Vctrl_in of NOR logic gate 715 is switched from the high state to the low state. Transistor M21 then turns on. Neuron 700 then starts a new integration phase similar to that previously discussed in relation with time t0.

Figure 10:
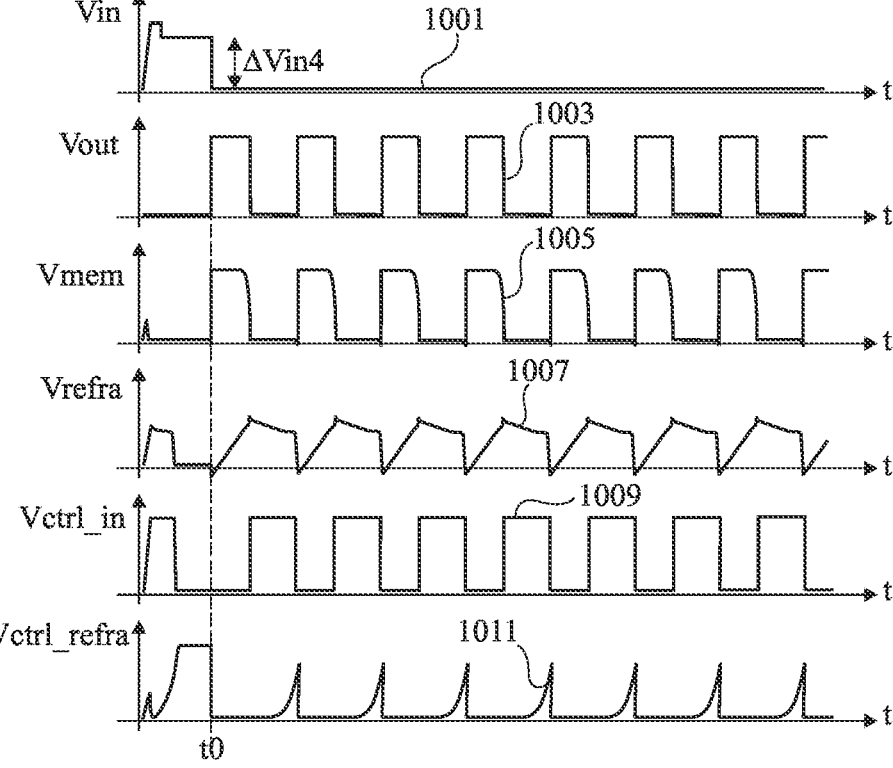
FIG. 10 is a timing diagram illustrating another example of operation of the circuit of the neuron of FIGS. 7 and 8.

FIG. 10 is a timing diagram illustrating another example of operation of the circuit of the neuron 700 of FIGS. 7 and 8.

The timing diagram of FIG. 10 more particularly illustrates, in curves 1001, 1003, 1005, 1007, 1009, and 1011, the variation according to time t: of input potential Vin; of output potential Vout; of membrane potential Vmem; of potential Vrefra for controlling transistor M2; of potential Vctrl_in for controlling transistor M21; and of potential Vctrl_refra for controlling transistor M20.

The example of operation illustrated in FIG. 10 differs from the example of operation illustrated in FIG. 9 mainly in that a potential step ΔVin4, having an amplitude greater than that of potential step ΔVin2, is applied to the gate of transistor M8 at time t0. The timing diagram of FIG. 10, for example, illustrates a case where neuron 700 is submitted to a strong synaptic excitation. The amplitude of the potential step ΔVin4 of FIG. 10 is, for example, similar to the amplitude of the potential step ΔVin2 of FIG. 6.

In the shown example, curve 1003 illustrating the variations of potential Vout comprises spikes having a substantially constant width, or duration. This is particularly due to the fact that capacitive node 215 is totally discharged by transistor M20 before the beginning of each new spiking phase, and thus keeps no residual charge, unlike circuit 400 in the example of operation of FIG. 6.

Further, refractory periods are distinct from the integration phases, as illustrated in curve 1005 of variation of potential Vmem. This is particularly due to the fact that transistor M21 enables to inhibit the excitation of capacitive node 201 by potential Vin. It is thus ensured that the potential Vmem of capacitive node 201 remains null for the duration of the refractory period, whatever the potential Vin applied to the gate of transistor M8.

An advantage of artificial neuron 700 lies in the fact that the duration of the pulses of output potential Vout is not affected, or is little affected, in case of a high synaptic excitation. Another advantage of artificial neuron 700 lies in the fact that refractory periods are well marked, even in case of a high synaptic excitation.

Various embodiments and variants have been described. Those skilled in the art will understand that certain features of these various embodiments and variants may be combined, and other variants will occur to those skilled in the art. In particular, the embodiment of neuron 700 discussed in relation with FIG. 8 is not limiting, and those skilled in the art may use other elements or circuits to obtain equivalent functionalities.

Finally, the practical implementation of the described embodiments and variants is within the abilities of those skilled in the art based on the functional indications given hereabove. In particular, the sizing of the transistors, capacitive elements, current sources, etc. of the circuit of neuron 700 is within the abilities of those skilled in the art.

The invention claimed is:

1. An electronic circuit of an artificial neuron, comprising:
 a first capacitive node of application of a membrane potential of the artificial neuron;
 a first transistor for discharging the first capacitive node;
 a second capacitive node driven according to the membrane potential and delivering a potential for controlling the first transistor;
 a second transistor for discharging the second capacitive node; and
 a control circuit configured to activate the second transistor in response to sensing a discharge of the second capacitive node below a threshold;
 wherein the second transistor is controlled according to a potential present at the second capacitive node.

2. The circuit according to claim 1, wherein the control circuit comprises an inverter having an input connected to the second capacitive node and having an output connected to a gate of the second transistor.

3. The circuit according to claim 1, wherein the second capacitive node is coupled to the first capacitive node by first and second inverters coupled in series at a fourth node.

4. The circuit according to claim 1, further comprising a fourth transistor coupled to the first capacitive node and to a fifth node of application of a potential for powering the artificial neuron.

5. An artificial neural network comprising at least one circuit according to claim 1.

6. An electronic circuit of an artificial neuron, comprising:
 a first capacitive node of application of a membrane potential of the artificial neuron;
 a first transistor for discharging the first capacitive node;
 a second capacitive node driven according to the membrane potential and delivering a potential for controlling the first transistor;
 a second transistor for discharging the second capacitive node,
 wherein the second transistor is controlled according to a potential present at the second capacitive node;
 wherein the second capacitive node is coupled to the first capacitive node by first and second inverters coupled in series at a fourth node; and
 a third transistor connected between a gate of the second transistor and a third node of application of a reference potential, wherein a gate of the third transistor is coupled by a third inverter to the fourth node.

7. The circuit according to claim 6, wherein the second capacitive node is coupled to the first capacitive node by first and second inverters coupled in series at a fourth node.

8. The circuit according to claim 6, further comprising a fourth transistor coupled to the first capacitive node and to a fifth node of application of a potential for powering the artificial neuron.

9. The circuit according to claim 6, further comprising a control circuit configured to activate the second transistor in response to sensing a discharge of the second capacitive node below a threshold.

10. An artificial neural network comprising at least one circuit according to claim 6.

11. An electronic circuit of an artificial neuron, comprising:
 a first capacitive node of application of a membrane potential of the artificial neuron;
 a first transistor for discharging the first capacitive node;
 a second capacitive node driven according to the membrane potential and delivering a potential for controlling the first transistor;
 a second transistor for discharging the second capacitive node,
 wherein the second transistor is controlled according to a potential present at the second capacitive node; and
 a fourth transistor coupled to the first capacitive node and to a fifth node of application of a potential for powering the artificial neuron;
 wherein the gate of the fourth transistor is connected to an output of a NOR gate having a first input connected to the gate of the second transistor and a second input connected to the first capacitive node.

12. The circuit according to claim 11, wherein the second capacitive node is coupled to the first capacitive node by first and second inverters coupled in series at a fourth node.

13. The circuit according to claim 11, further comprising a control circuit configured to activate the second transistor in response to sensing a discharge of the second capacitive node below a threshold.

14. An artificial neural network comprising at least one circuit according to claim 11.

15. An electronic circuit of an artificial neuron, comprising:
 a first capacitive node of application of a membrane potential of the artificial neuron;
 a first transistor for discharging the first capacitive node;

a second capacitive node driven according to the membrane potential and delivering a potential for controlling the first transistor;

a second transistor for discharging the second capacitive node, wherein the second transistor is controlled according to a potential present at the second capacitive node; and a fourth transistor coupled to the first capacitive node and to a fifth node of application of a potential for powering the artificial neuron;

wherein the fourth transistor is coupled to the first capacitive node by a fifth transistor having a gate configured to receive a potential for exciting the artificial neuron.

16. The circuit according to claim 15, wherein the second capacitive node is coupled to the first capacitive node by first and second inverters coupled in series at a fourth node.

17. The circuit according to claim 15, further comprising a control circuit configured to activate the second transistor in response to sensing a discharge of the second capacitive node below a threshold.

18. An artificial neural network comprising at least one circuit according to claim 15.

\* \* \* \* \*